United States Patent
Datta et al.

(10) Patent No.: US 6,656,750 B1
(45) Date of Patent: Dec. 2, 2003

(54) METHOD FOR TESTING CHIPS ON FLAT SOLDER BUMPS

(75) Inventors: Madhav Datta, Yorktown Hts., NY (US); Peter A. Gruber, Mohegan Lake, NY (US); Judith M. Rubino, Ossining, NY (US); Carlos J. Sambucetti, Croton Hudson, NY (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 09/301,889

(22) Filed: Apr. 29, 1999

(51) Int. Cl.⁷ .................. G01R 31/26; H01L 21/66; H01L 21/44; B23K 31/00
(52) U.S. Cl. .............. 438/14; 438/15; 438/17; 438/613; 228/180.22
(58) Field of Search ................. 438/612, 613, 438/615, 616, 14, 15, 17; 29/839, 840; 228/180.22

(56) References Cited

U.S. PATENT DOCUMENTS

| | | | | |
|---|---|---|---|---|
| 5,587,342 A | * | 12/1996 | Lin et al. ............... | 438/614 |
| 5,767,010 A | * | 6/1998 | Mis et al. ............... | 438/614 |
| 5,880,017 A | * | 3/1999 | Schwiebert et al. ...... | 438/613 |
| 5,886,362 A | * | 3/1999 | Millican et al. .......... | 438/14 |
| 5,909,634 A | * | 6/1999 | Hotchkiss et al. ........ | 438/612 |
| 5,937,320 A | * | 8/1999 | Andricacos et al. ...... | 438/614 |

* cited by examiner

*Primary Examiner*—David E. Graybill
(74) *Attorney, Agent, or Firm*—Robert M. Trepp; Randy W. Tung

(57) ABSTRACT

A method for testing integrated circuit chips with probe wires on flat solder bumps and IC chips that are equipped with flat solder bumps are disclosed. In the method, an IC chip that has a multiplicity of bond pads and a multiplicity of flat solder bumps are first provided in which each of the solder bumps has a height less than ½ of its diameter on the multiplicity of bond pads. The probe wires can thus be easily used to contact the increased target area on the solder bumps for establishing electrical connection with a test circuit. The probe can further be conducted easily with all the Z height of the bumps are substantially equal. The height of the solder bumps may be suitably controlled by either a planarization process in which soft solder bumps are compressed by a planar surface, or solder bumps are formed in an in-situ mold by either a MSS or an electroplating process for forming solder bumps in the shape of short cylinders. When the MSS method is used for planting the bumps, solder bumps are transferred onto the wafer surface in a substantially flattened hemi-spherical shape.

7 Claims, 2 Drawing Sheets

METHOD FOR TESTING CHIPS ON FLAT SOLDER BUMPS

FIELD OF THE INVENTION

The present invention generally relates to a method for testing integrated circuit (IC) chips with probe needles on solder bumps and more particularly, relates to a method for testing IC chips with probe needles on solder bumps that have substantially flattened top surfaces for ease of probing and IC chips that have flattened solder bumps planted on top.

BACKGROUND OF THE INVENTION

In the fabrication process for IC devices, wafer probing is currently practiced after the evaporated solder has been reflowed such that lead and tin which are deposited sequentially can be properly mixed. In the electroplating deposition process, lead and tin are deposited simultaneously to form an alloy. However, the surface as deposited is rough and soft, thus making it difficult to probe with probe needles. A reflow process is therefore required to produce a smooth, spherical surface for the probe needles. After the reflow process is carried out, the shape of the solder bumps becomes spherical. This is shown in FIG. 1.

The solder ball 10 shown in FIG. 1 presents a probing target that is difficult to contact. The difficulties encountered are two fold. First, as a spherical shape shown in FIG. 1, there is a rapid variation in the Z height for a small change in the X-Y plane, i.e., the distance B shown in FIG. 1. The large variation in Z height requires that both the probe wires and the solder balls be extremely well aligned. When a probe wire, or needle, is slightly misplaced in the X-Y plane from the exact center of the solder ball 10, the probe wire must travel much further in the Z direction to contact the solder ball 10 due to its spherical shape. Secondly, if a solder ball is significantly below the specified volume, as shown in FIG. 2 where solder ball 20 has a lower than specified volume, the probe wire 22 must travel further in the Z direction to contact the top surface of the solder ball 20. Both of the above described problems require the probe wire to be overdriven, or the entire probe head to be overdriven, such that all the probe wires are pushed harder against their solder ball targets so that the probe wires for either a low volume or an off-center ball still hit their target. This presents another processing problem in that since most solder balls are of the proper size and in the correct location, overdriven probe wires can damage these solder balls excessively due to the extra mechanical force required to contact problem balls. This may even result in solder sticking to the probe wires when the probe pad is withdrawn from the wafer, or the chip. This both contaminates the probe head and affects the solder ball volume uniformity. It is therefore desirable to provide an improved chip or wafer testing method in which probe wires are used to contact solder bumps before the bumps are reflown into solder balls. The solder bumps ideally should have a consistent Z height and increased target area for contacting by the probe wires.

It is therefore an object of the present invention to provide a method for testing IC chips with probe wires that does not have the drawbacks or shortcomings of the conventional test methods.

It is another object of the present invention to provide a method for testing IC chips with probe wires by providing an IC chip with a multiplicity of solder bumps on an active surface wherein the bumps each having a height less than ½ of its diameter.

It is a further object of the present invention to provide a method for testing IC chips with probe wires on flat solder bumps in which a multiplicity of solder bumps is planted by a technique of evaporation, electroplating, injection molded solder or molten solder screening.

It is another further object of the present invention to provide a method for testing IC chips with probe wires on solder bumps that have substantially flattened top surfaces such that an increased target area is available for contacting the probe wires.

It is still another object of the present invention to provide a method for testing IC chips with probe wires on substantially flattened top surfaces of solder bumps by first forming the solder bumps with a soft solder material and then planarizing the bumps by a platen with a planar surface.

It is yet another object of the present invention to provide a method for testing IC chips with probe wires on substantially flattened top surfaces of solder bumps wherein the solder bumps are deposited in an in-situ solder mold forming pancake-like solder bumps by an electroplating or molten solder screening technique.

It is still another further object of the present invention to provide an IC chip that has substantially flattened solder bumps on an active surface and the bumps are formed in flattened hemi-spherical shape on a multiplicity of bond pads wherein each of the bumps has a height less than ½ of the maximum diameter of the hemi-spherical shapes.

It is yet another further object of the present invention to provide an IC chip that has flat solder bumps on an active surface wherein the bumps are formed in cylindrical shape on a multiplicity of bond pads with each of the bumps having a height less than ½ of the diameter of the cylindrical shape.

BRIEF DESCRIPTION OF THE DRAWINGS

These and other objects, features and advantages of the present invention will become apparent upon consideration of the specification and the appended drawings, in which.

DETAILED DESCRIPTION OF THE PREFERRED EMBODIMENT

The present invention discloses a method for improving electrical probing of evaporated, electroplated or MSS (molten solder screening) deposited solder bumps.

The MSS technique is a more recently developed method that does not have the limitations of the solder paste screening technique of significant volume reductions between the initial paste and the final solder volume. In the MSS method, pure molten solder is dispensed. When the MSS solder-bumping method is used on large substrates such as 8 inch or 12 inch wafers, surface tension alone is insufficient to maintain intimate contact between a mold and a substrate. In order to facilitate the required abutting contact over large surface areas, a new method and apparatus for maintaining such are therefore necessary.

For instance, in a co-pending application Ser. No. 09/070, 121 commonly assigned to the Assignee of the present application and is hereby incorporated by reference in its entirety, a method for forming solder bumps by a MSS technique that does not have the drawbacks or shortcomings of the conventional solder bumping techniques has been proposed. In the method, a flexible die member is used in combination with pressure means to enable the die member to intimately engage a mold surface and thus filling the mold cavities and forming the solder bumps. The flexible die head also serves the function of a wiper by using a trailing edge for removing excess molten solder from the surface of the mold.

Typically, the present invention method can be performed on an entire wafer or on an IC chip. The present invention novel method can be carried out by several alternative techniques which will be discussed in several embodiments of the present invention.

The present invention generally discloses a method by which both electroplated C4 chip I/O interconnects and MSS structures can be probed at final wafer test in an improved manner. The improvement is based on the fact that reflowed C4 structures are spherical and present difficult targets to probe uniformly at final wafer test. The fall-off in Z height from spheres not situated on perfect centers or differing in volume is drastic. The present invention provides a method in which the targets, or the C4's to be probed are increased in area, as well as uniform in their Z height such that many processing problems are alleviated or minimized.

In the conventional practice, wafers plated with 97/3 Pb/Sn are reflowed before final wafer tests. The reflow process is necessary after the C4 evaporation of Pb/Sn through solder masks in order to mix the components and join them to the ball limiting metallurgy on top of the wafer.

Figure 1:
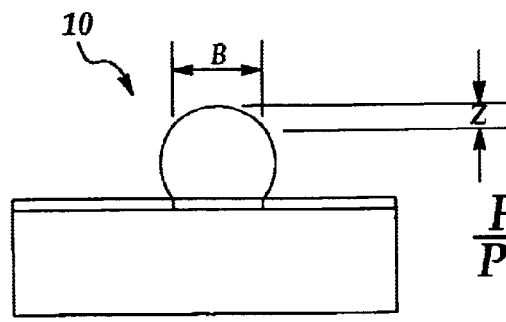
FIG. 1 is an enlarged, cross-sectional view of a conventional solder ball after a reflow process formed from a solder bump.
Figure 2:
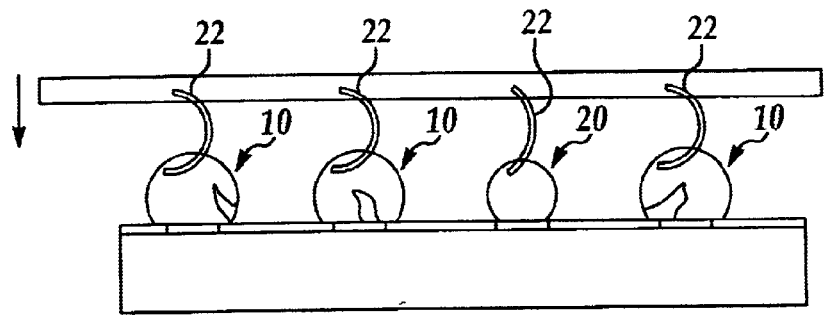
FIG. 2 is an enlarged, cross-sectional view of a conventional probe testing apparatus with the probe pad and probe wires pressed upon a multiplicity of solder balls planted on an IC chip.
Figure 3A:
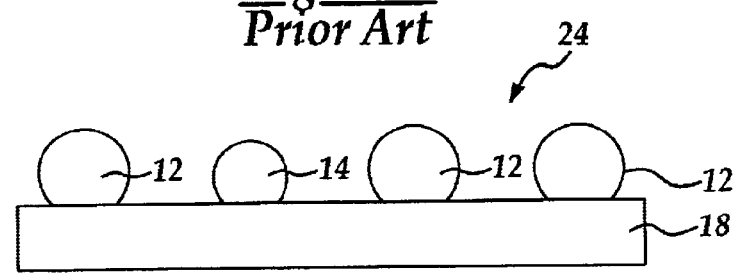
FIG. 3A is an enlarged, cross-sectional view of a present invention IC chip to be tested which contains an under-volumed solder ball planted on top.
Figure 3B:
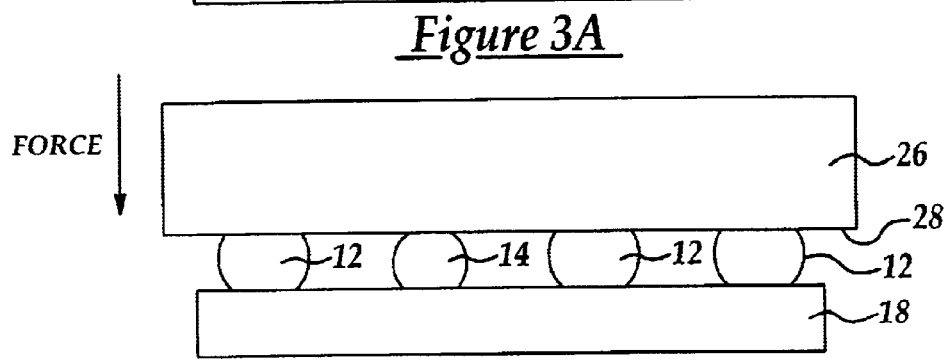
FIG. 3B is an enlarged, cross-sectional view of the IC chip of FIG. 3A with a flat platen compressed on top surfaces of the solder bumps.
Figure 3C:
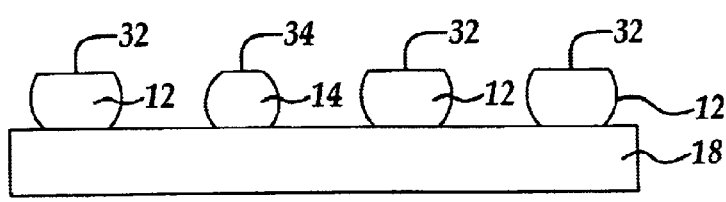
FIG. 3C is an enlarged, cross-sectional view of the present invention IC chip of FIG. 3A after the top of the solder bumps are planarized by the flat platen.

In a preferred embodiment, as shown in FIGS. 3A, 3B and 3C, evaporated solder bump structures after reflow, i.e. solder balls 12 and 14 that are planted on wafer 18 forming an IC device 24, wherein solder ball 14 is under-volumed and has a smaller Z height. In the preferred embodiment method, a flat platen 26 which has a flat planar surface 28 is pressed onto the top surfaces of the solder balls 12, 14 in a planarization process. It should be noted that the solder balls are normally electroplated with 97/3 Pb/Sn solder material and are thus soft enough for the flat platen 26 to flatten the top surfaces.

After the planarization process is conducted, as shown in FIG. 3B, the solder balls 12,14 are planarized to have the same Z height and a generally increased target area 32,34 on the solder balls, respectively.

In general, the evaporated structure after reflow can be planarized on the handler during final test in order to increase, i.e., up to four fold, the target area to be probed while eliminating the probe overdrive which would otherwise be necessary for contacting an under-volumed ball. The amount of planarization of the C4 balls is limited by the reflow characteristics of the structure after probing.

For both evaporated and electroplated solder balls, a reflow step is normally required after deposition for mixing the alloy materials, such as lead and tin. For high temperature solder balls which typically reflow at about 300° C., it is possible to planarize the array of solder balls before probing. This is possible because these alloys contain mostly lead (90% or more) which is very soft and thus deformable. The planarization can be readily carried out on a handler during the final wafer test procedure. The spherical balls, after the planarization process is carried out, have a flat top which provides two major benefits. First, all balls have the top probing surface at the exact same Z height and secondly, the target area is increased over a non-planarized array. The benefits achieved by the present invention is self evident by an examination of FIG. 3C. The solder balls 12,14 revert back to a spherical shape during the final reflow process for attaching the diced chips to the substrates.

In an alternate embodiment of the present invention novel method, a similar method can be applied to an MSS structure after solder bumps are first transferred to the wafer or substrate from the solder mold plate. The transferred MSS structure has an increased surface area as well as a uniform Z height and does not require the planarization step as described above utilized for plated C4 bumps. The MSS structure is also on perfect center since it is an exact duplicate of the mold plate. After final test probing, the MSS structure can be reflowed.

The method for increasing the target areas, at a uniform Z height, eliminates many problems for the testing process. Hitting all the balls with proper contact resistance and minimal physical damage is problematic when the probe wires are not on perfect center or planar, or C4 balls that vary in volume, and thus height, and distance from their ideal location. In the past, in order to overcome these problems, the probes have to be overdriven resulting in excessive physical damage to the balls that have the correct volume and are in the correct location. There are further processing problems of picking up and transferring solder as a result of overdrive.

Figure 4A:
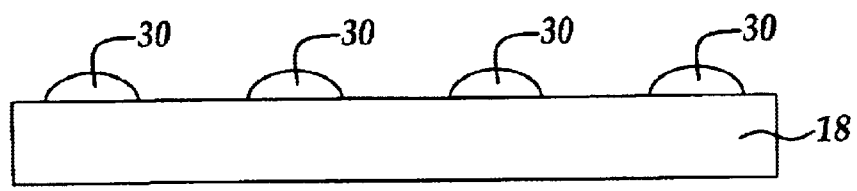
FIG. 4A is an enlarged, cross-sectional view of a present invention IC chip that has flattened hemi-spherical solder bumps planted on a top surface.
Figure 4B:
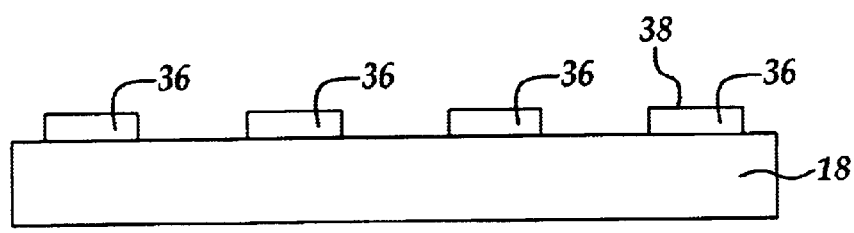
FIG. 4B is an enlarged, cross-sectional view of a present invention IC chip that has electroplated short cylinders planted on a top surface.

It should be noted that unlike lead-rich solders, tin-rich solders are harder and thus less easily damaged during probing. For low temperature, tin-rich solder balls which typically reflow at a temperature of between about 180° C. and about 200° C. which include eutectic tin-lead, for instance as Sn 63/Pb37 at 183° C., the solder bumps may be probed immediately after deposition. This enables an immediate improvement due to the as-deposited solder preformed shape. As shown in FIGS. 4A and 4B, both the MSS deposited solder bumps 30 and the electroplated solder bumps 36 have preformed shapes that are substantially flat topped. With the MSS method, once the solder has been transferred from the mold to the wafer, the solder preforms have a flattened hemi-spherical shape as shown in FIG. 4A. Since the preforms exactly replicate the mold cavities, they all have the same Z height and also have a large target area. The preforms deposited by electroplating, such as those shown in FIG. 4B, are also at constant Z height and thus have a shape like a short cylinder. The height of the cylinder is normally less than ½ of the diameter of the cylinder. The top of the short cylinders 36 therefore offers a large target area 38 for the probe wires. After probing by probe wires, all the preforms again revert to fully spherical solder balls during the final reflow process to attach the diced chips to the laminates.

In a second alternate embodiment of the present invention method, an in-situ solder mold 40 is used to produce solder bumps, or preforms of desirable shapes. A suitable in-situ mold material may be a polyimide which can be screen printed directly on top of a wafer. The final polyimide layer may further be a passivation layer that is patterned by a standard photolithographic method. In this embodiment, the deposited solder layers are initially completely flat since they are defined by the plane of the polyimide mold layer. This makes the probing by probe wires easy both in a Z direction, i.e. since all the probe sites are at exactly the same height, and also in the X-Y direction, i.e. since the as-deposited solder pad diameters are much larger than the final reflowed ball diameters.

Figure 5A:
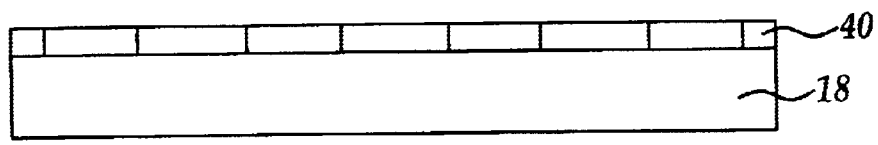
FIG. 5A is an enlarged, cross-sectional view of a present invention IC chip that has solder bumps planted in an in-situ mold placed on top of the chip and filled with a molten solder screening process.
Figure 5B:
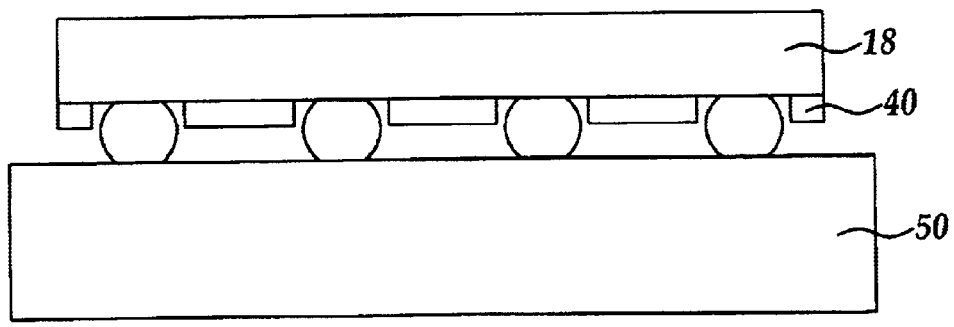
FIG. 5B is an enlarged, cross-sectional view of the IC chip of FIG. 5A after the solder bumps are reflown into solder balls for a final chip attach process.

As seen in FIGS. 5A and 5B, when the final passivation layer 40 on the wafer 18 also serves as the in-situ mold, the MSS deposited solder is completely flush with the top surface of the passivation layer. This produces a uniformly flat solder surface from pad-to-pad for all the probe wires. Secondly, since the final solder volume for the ball is contained in a preform that has a relatively short Z height, there is a correspondingly greater target area for the probe wires. For instance, for a solder ball that has a final height of 3~4 mils, the as-deposited solder preform may reside in a cavity with a diameter of 5~6 mils with an appropriate depth to achieve the desired volume on final reflow. The probe target area made available by the present invention third preferred embodiment is much larger than for a solder ball.

After the wire probing is carried out, the solder preforms may be kept in their as-deposited shape through wafer dicing, chip storage, etc. Only at the final chip attach stage, the solder is reflowed such that the preform changes into the final solder ball shape by surface tension due to the effect of a fluxing agent or any other surface enhancement agent. This is shown in FIG. 5B with the reflowed solder balls in an upside-down position contacting a laminated substrate 50. In this case, the in-situ mold 40 is also left on the surface of the wafer 18 as a passivation layer.

It should be noted that while the three embodiments described above are carried out on silicon wafers, the present invention novel method may also be applied to substrate applications such as in miro-BGA's. In such applications, the MSS mold transfer is typically used for solder bumping. As previously described, if the probing is done immediately after transfer when the mold is initially removed, the solder preforms deposited on the substrates will all be at the same height and have larger diameters than when subsequently reflowed into solder balls. The intermediate point is when the probe testing is conducted.

While the present invention has been described in an illustrative manner, it should be understood that the terminology used is intended to be in a nature of words of description rather than of limitation.

Furthermore, while the present invention has been described in terms of a preferred and two alternate embodiments thereof, it is to be appreciated that those skilled in the art will readily apply these teachings to other possible variations of the invention.

The embodiment of the invention in which an exclusive property or privilege is claimed are defined as follows:

1. A method for testing integrated circuit (IC) chips with probe needles on flat solder bumps comprising the steps of:

providing an IC chip with a multiplicity of bond pads on an active surface, planting a multiplicity of solder bumps each having a height less than ½ of its diameter on said multiplicity of bond pads, flattening said multiplicity of solder bumps by a platen forming a substantially flattened top surface on each of said bumps, and contacting said solder bumps with probe needles and establishing electrical connections with a test circuit.

2. A method for testing IC chips with probe needles on flat solder bumps according to claim 1 further comprising the steps of:

planting said multiplicity of solder bumps with a solder material containing at least 80% lead, and flatten the top surfaces of said multiplicity of solder bumps by a platen having a planar surface.

3. A method for testing IC chips with probe needles on flat solder bumps according to claim 1 further comprising the steps of:

forming an in-situ solder mold on top of said IC chip with said multiplicity of solder bond pads exposed in a multiplicity of cavities, filling said multiplicity of cavities with an electroplated solder material, and removing said in-situ solder mold.

4. A method for testing IC chips with probe needles on flat solder bumps according to claim 3, wherein said in-situ solder mold is formed of a polymeric material.

5. A method for testing IC chips with probe needles on flat solder bumps according to claim 3, wherein said in-situ solder mold is formed of a screen-printable polyimide material.

6. A method for testing IC chips with probe needles on flat solder bumps according to claim 3, wherein said electroplated solder material filling said multiplicity of cavities forming short cylinders.

7. A method for testing integrated circuit (IC) chips with probe needles on flat solder bumps comprising the steps of:

providing an IC chip with a multiplicity of bond pads on an active surface, planting a multiplicity of solder bumps each having a top surface on said multiplicity of bond pads, flattening said top surfaces of said multiplicity of solder bumps by a platen having a planar surface, and contacting said solder bumps with probe needles and establishing electrical connections with a test circuit.

* * * * *